United States Patent [19]

Mondl

[11] Patent Number: 4,796,000

[45] Date of Patent: Jan. 3, 1989

[54] OPTICAL POTENTIOMETER

[75] Inventor: John T. Mondl, Akron, Ohio

[73] Assignee: David N. Friedland, Akron, Ohio

[21] Appl. No.: 856,462

[22] Filed: Apr. 28, 1986

[51] Int. Cl.[4] .................. H01L 31/08; H01C 10/10
[52] U.S. Cl. ............................. 338/15; 338/99; 338/114
[58] Field of Search .............. 338/99, 15, 92, 114

[56] References Cited

U.S. PATENT DOCUMENTS

| | | | |
|---|---|---|---|
| 3,087,069 | 4/1963 | Yeates | 338/15 X |
| 3,723,934 | 3/1973 | Kubitzek et al. | 338/15 |
| 3,859,617 | 1/1975 | Oka et al. | 338/15 |
| 3,968,006 | 7/1976 | Zimmerman | 338/15 X |
| 4,305,321 | 12/1981 | Cohn | 338/99 X |
| 4,523,090 | 6/1985 | Wagner | 338/15 X |
| 4,570,149 | 2/1986 | Thornburg et al. | 338/99 X |

Primary Examiner—E. A. Goldberg
Assistant Examiner—M. M. Lateef
Attorney, Agent, or Firm—Renner, Kenner, Greive, Bobak, Taylor & Weber

[57] ABSTRACT

Optical and digital potentiometers and controllers. In one embodiment of the invention, a paddle slider is maintained within a housing along with a light source and sensor. The amount of light received by the sensor is a function of the position of the slider and, accordingly, a control signal output may be developed corresponding to the mechanical position of the slider. In other embodiments, light sources are caused to impinge on reflective surfaces which reflect the light through a film onto additional reflective surfaces which direct the light to a sensor. The film may be of varying optical density along the length thereof such that the amount of light received corresponds to the position of the slider, or the film may be digitally encoded such that separate light beams received by the sensor will correspond to a digital position of the slider. In another embodiment, a cylindrical digitally encoded film is rotated between a light source and sensor, thereby varying the output of the sensor. In still another embodiment, a pressure bar is maintained upon a slide and transverses a switch pad which is connected to an electronic decoding circuit. As the slide is moved, the output of the switch pad changes as a digital function of the position of the slide.

30 Claims, 7 Drawing Sheets

OPTICAL POTENTIOMETER

TECHNICAL FIELD

The invention herein resides in the art of electronic control devices and, more particularly, to optical and digital potentiometers providing output control signals indicative of the position of a control member which is sensed optically or electronically.

BACKGROUND ART

Heretofore it has been known to utilize potentiometers and rheostats for purposes of controlling voltage and/or power to a controlled device. Sound and lighting systems are principal examples of systems which may be controlled by such devices. Previously known potentiometers and rheostats, used hereinafter interchangeably, have utilized a wiper upon a linear resistor to tap off a selected voltage which might be used directly to control the desired system or be used for application to a control circuit to effect the desired control. Previously known rheostats have lacked durability due to mechanical wear which increases electronic noise with age. Further, the electromechanical nature of such rheostats or controllers has been such as to generate undesired noise which could be coupled to surrounding systems. Additionally, dirt, corrosion, or the like has had a tendency to build up on such known controllers, necessitating frequent cleaning to prevent their ultimate inoperability.

It has also been found that the physical size of previously known controllers has been excessive, the power requirements and/or desired sensitivity dictating such size. Furthermore, with the advent of computer controlled systems, the need for a more direct way of interfacing humanly controlled systems to the controlling computer is apparent.

Accordingly, there is a need in the art of a controller or rheostat which eliminates the electromechanical contact of previous controllers, which is impervious to adverse effects from the ambient, and which is highly reliable in operation while allowing construction within accepted standards of physical size.

DISCLOSURE OF THE INVENTION

In light of the foregoing, it is a first aspect of the invention to provide a photoelectric controller having no electromechanical contacting points.

Another aspect of the invention is the provision of a photoelectric controller which generates no electronic noise in operation.

Still a further aspect of the invention is the provision of a photoelectric controller which is of compact size while allowing a high degree of control resolution.

Still another aspect of the invention is the provision of a photoelectric controller which is simple and inexpensive to construct and maintain using state of the art elements.

The foregoing and other aspects of the invention which will become apparent as the detailed description proceeds are achieved by an optical potentiometer, comprising: a housing; a light source within said housing; a light sensor within said housing; and selectively movable reflecting means within said housing for receiving light from said light source and reflecting a quantum of said light to said light sensor as a function of the position of said reflecting means within said housing, said light sensor providing an output signal corresponding to said quantum of light sensed thereby.

Other aspects of the invention are achieved by an optical potentiometer, comprising: a housing; a light source within said housing; a light sensor within said housing in juxtaposition to said light source; and a media of varying optical density maintained between said light source and light sensor, said media adapted for relative movement between said light source and light sensor.

Yet further aspects of the invention are attained by a digital encoder, comprising: a housing; a switch pad maintained along an inner first side of said housing; and a slide received within a second side of said housing opposite said first side, said slide movable along said second side and having a bar transversely engaging said switch pad for selectively activating tranverses areas of said switch pad.

DESCRIPTION OF THE DRAWINGS

For a complete understanding of the objects, techniques and structure of the invention reference should be had to the following detailed description and accompanying drawings wherein.

BEST MODE FOR CARRYING OUT THE INVENTION

Figures 1A, 1B, 2A, 2B, 3A, 3B:
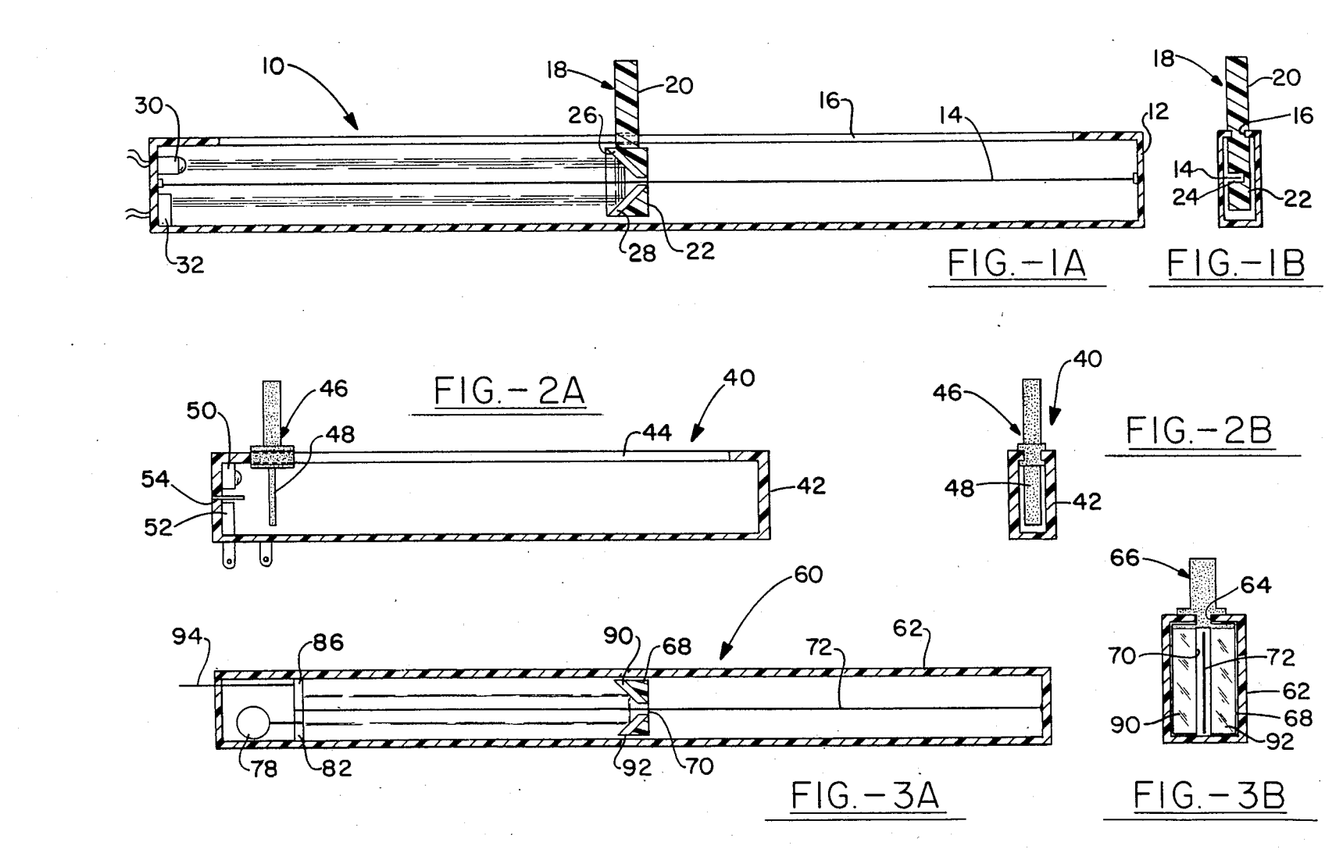
FIG. 1A is a side sectional view of a first embodiment of the invention.
FIG. 1B is a cross sectional view of the embodiment of FIG. 1A showing the slider retained within the housing.
FIG. 2A is a side sectional view of a second embodiment of the invention.
FIG. 2B is a sectional view of the embodiment of FIG. 2A showing the slider retained within the housing.
FIG. 3A is a top illustrative view of a third embodiment of the invention.
FIG. 3B is a sectional view of the embodiment of FIG. 3A showing the slider received within the housing.

Referring now to the drawings and more particularly FIGS. 1A and 1B, it can be seen that a photoelectric controller according to one embodiment of the invention is designated generally by the numeral 10. The controller 10 comprises a casing or housing 12 which may be formed of plastic, metal, or any suitable material. Preferably, the interior of the housing 12 has a dull flat black surface to limit light reflection therein. Extending longitudinally within the housing 12 and between each end thereof is a film 14 which, for purposes to be discussed hereinafter, is of varying optical density. A slot 16 is provided in the top of the housing 12 to receive a slider 18 therein as best shown in FIG. 1B. The slider 18 includes a handle 20 necked down to be received within the slot 16 and to be supported on either side thereof.

The slider 18 includes a body portion 22 having a passage 24 provided therein for receiving the film 14, again as best shown in FIG. 1B. The body portion 22 receives and maintains first and second angled reflective surfaces 26,28, as shown in FIG. 1A. These reflective surfaces are preferably of polished metal, mirror, or backed glass so as to be highly reflective to light.

Positioned at a common end within the housing 12 is a light source 30 and a photodetector 32. Preferably, the light source 30 is a collimated light source such as a low power laser or the like. The photodetector 32 is, of course, responsive to light of the frequency of the light source 30. As is well known in the art, the photodetector 32 presents an output voltage which is a function of the light sensed thereby.

It will be appreciated that the slider 18 is movable under operator control longitudinally within the housing 12 such that the body portion 22 may be selectively positioned at any given distance from the common end of the housing 12 maintaining the light source 30 and photodetector 32. The angled reflective surfaces 26,28 are so positioned that light from the light source 30 incident to the reflective surface 26 is reflected to the reflective surface 28 and thence directed to the photodetector 32. Preferably, the angled reflective surfaces 26,28 are normal to each other, forming 45° angles to the vertical as shown in the drawing.

As discussed above, the film 14 is of varying optical density along the length thereof. It will be appreciated that the optical density could vary linearly along the length of the film 14, but the optical density could vary according to any of numerous desirable functions with respect to the length along the film. Suffice it to say that each point on the film has associated therewith a unqiue optical density. The output of the photodetector 32, being a function of the light incident thereto, also becomes a function of the position of the slider 18 along the housing 12. In other words, with the light source 30 being of fixed intensity, the amount of light sensed by the photodetector 32 will be indictative of the point along the film 14 at which the light passes from the reflective surface 26 to the reflective surface 28. Accordingly, the output of the photodetector 32 is a function of the position of the slider 18.

In use, an operator moves the slider 18, changing the output of the photodetector 32, which output is then used as the control signal input to a voltage or power control circuit for ultimately controlling the power applied to the controlled system.

A more simplistic embodiment of a photoelectric controller is shown in FIGS. 2A and 2B and designated generally by the numeral 40. Here again, a housing 42 is provided with a non-reflective inner surface as by the application of a flat black paint or the like. A slot 44 is provided within the housing 42 for receiving a slider 46. The slider 46 has a flat paddle 48 extending into the housing 42. The flat paddle 48 is preferably of a highly reflective nature with respect to light, having a polished white surface or the like thereon.

A light source 50 and a photosensor or detector 52 are again maintained at a common end of the housing 42. In this embodiment, however, the light source 50 may be a point source of light rather than collimated light. In such instance, a baffle 54 is interposed to separate the light source 50 and detector 52.

The point source of light 50 emits a cone of light in standard fashion. Therefore, as the paddle 48 moves away from the point source of light 50, progressively less light becomes incident to it. The light incident to the paddle 48 is reflected therefrom back to the sensor 52 which also has a conical field of view. Accordingly, for any position of the paddle 48 there is a unique amount of reflected light to be received by the sensor 52, assuming that the point source of light 50 provides a continuous uniform light source. It should therefore be seen that the position of the slider 46 and paddle 48 establishes the output of the photodetector 52 which can then be used as a control signal to regulate or control a voltage or power source. While the output signal from the photodetector 52 may be used in any of numerous ways, increasing or decreasing power control with such movement, it will be understood that as the paddle 48 moves further from the light source 50, the output from the detector 52 decreases.

Yet another embodiment of the invention may be seen with reference to FIGS. 3A-3E. As shown in FIG. 3A, it can b seen that a photoelectric controller is designated generally by the numeral 60. Again, a housing 62 having an interior of low light reflectance is provided. A slot 64 is maintained in the top of the housing 62 for receiving the slider 66. The slider 66 includes a body portion 68 having a slot 70 therein for receiving a vertically positioned film 72 therein. As shown in FIG. 3A, reflective surfaces 74,76 are maintained on each side of the film 72 so as to reflect light therethrough in a manner to be discussed directly below.

Figure 3C:
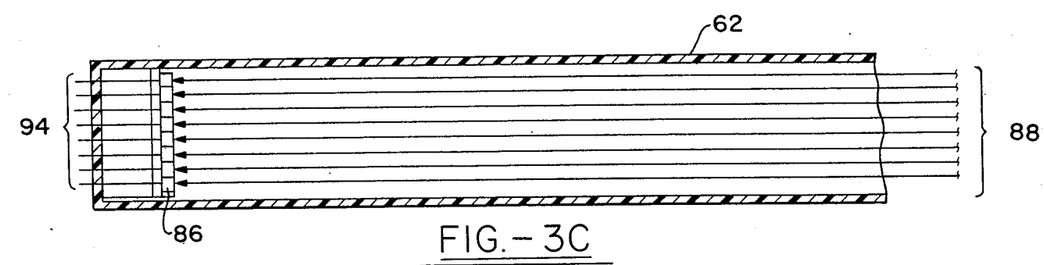
FIG. 3C is a front side illustrative view of the embodiment of FIG. 3A showing the arrangement of the photodetector array thereof.
Figure 3D:
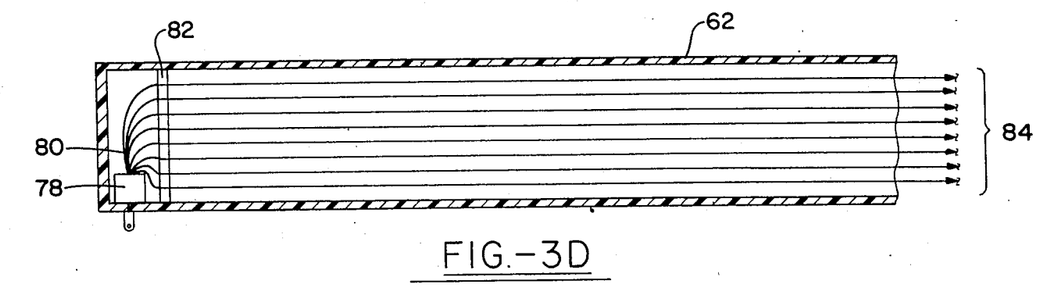
FIG. 3D is an illustrative side view of the embodiment of FIG. 3A showing the arrangement of the fiber optic array of the invention.

A light source 78 of laser or collimated light is connected to a fiber optic array which is positioned by means of an alignment plate 82. The alignment plate 82 provides for the generation of a plurality of light rays 84 which are cast down one side of the interior of the housing 62 as shown in FIG. 3D. In the preferred embodiment of the invention, there are provided eight optic fibers in the fiber optic array 80, thus generating eight parallel light rays 84 to be incident to the reflective surface 92. In like manner, a photodetector array 86 of eight detectors is provided on the opposite side of the housing 62 to receive the reflected light from the reflective surface 90. These reflected rays are designated by the numeral 88 in FIG. 3C. Each of the photodetectors of the array 86 has its own output, designated by the numeral 94.

Figure 3E:
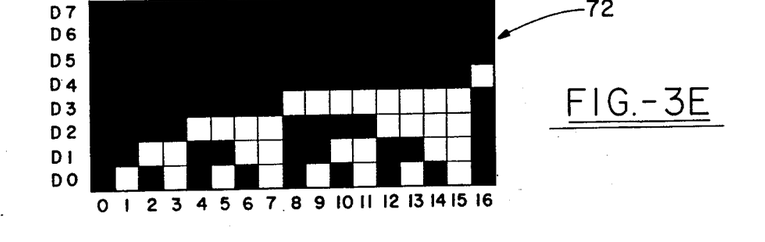
FIG. 3E is a partial illustration of a binary coded film as used in the embodiment of FIG. 3A.

As shown in FIG. 3E, the film 72 has eight tracks, one aligned with each pair of collimated light sources 80 and photodetectors 86. The film is binary coded such that each of the eight tracks has a value from $2^0$–$2^7$. Accordingly, the output of the photodetector array 86 is a binary number from 0–255. The photoelectric controller 60 accordingly has a resolution of 1/256, the output thereof being variable according to 256 equal increments.

It will be understood that as the slider 66 is moved longitudinally along the housing 62, the eight light beams from the light source 78–82 is reflected by the surface 92 to the film 72. Depending upon the position of the slider, certain of the eight light beams 84 will be transmitted through the film 72 and others will be blocked, it being understood that the light portions of the film 72 as shown in FIG. 3E are light tranmissive, while the black portions are opaque or impervious to the light. Accordingly, only certain of the light beams 88 will be present, depending upon the position of the slider 66, to effect the corresponding photodetectors of the array 66. The output at 94 will thus be a binary number indicative of the position of the slider. It will be understood in the embodiment of the photoelectric controller 60, the photodetectors of the array 86 operate in an on-off mode, presenting either a "one" or a "zero" output in standard digital or binary fashion. Of course, the outputs 94 may be used for application to a digital controller for again effecting power to the controlled system or device.

In use, the operator simply moves the slider 66 along the slot 64, observing change in the controlled system until the desired control function is obtained. As noted above, the eight light sources and eight photodetectors, combined with the binary-coded film 72 allows for a resolution of 1/256, from full off to full on.

It will be appreciated in all of the embodiments above that there is optical, rather than electromechanical control achieved. Noise is not generated and, while the light sources may change slightly over a long period of time, the actual control function which can be generated utilizing any of the devices presented above is not adversely affected. The photoelectric controllers of the invention all present an output signal indicative of the physical position of the slider with respect to the housing. By utilizing reflected light, the resolutions of the systems can remain highly accurate and sensitive while the packaging of the system may be significantly reduced.

Figure 4A:
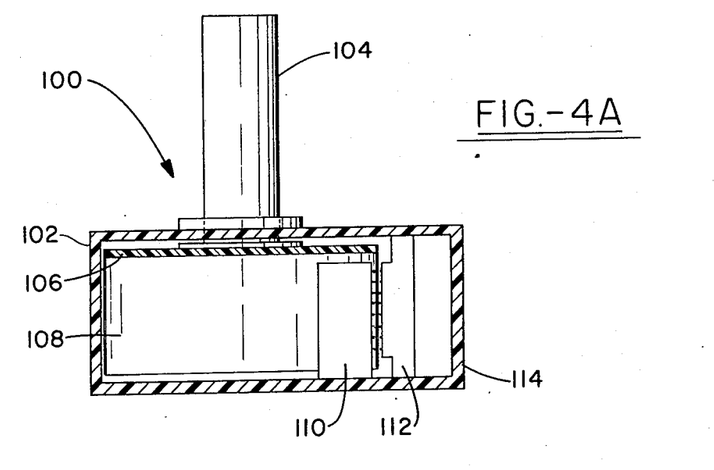
FIG. 4A is a partial sectional front view of a rotary photodetector controller according to the invention.
Figure 4B:
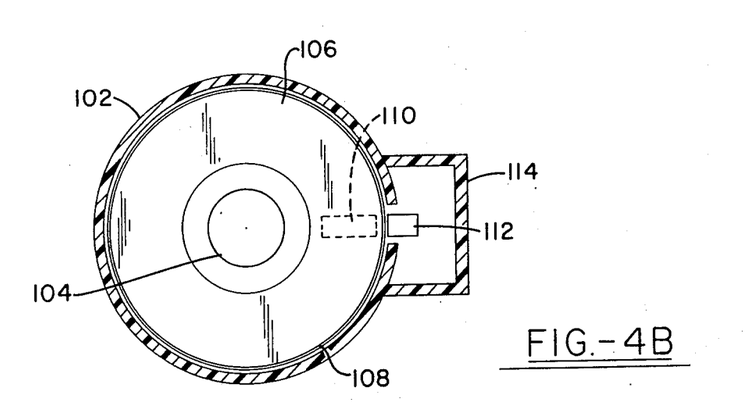
FIG. 4B is a partial sectional top view of the controller of FIG. 4A.

With reference now to FIG. 4, yet another embodiment of the invention may be seen. Here, a rotary photodetector controller is designated generally by the numeral 100. A cylindrical housing 102 has a rotary shaft 104 extending therefrom, with one end thereof connected to a disk 106 maintained within the housing 102. Digitally encoded film 108 is connected about the periphery of the disk 106 as shown to form a substantially cylindrical film member. The film is encoded substantially as that shown in FIG. 3E, having eight channels or tracks thereon, each passing circumferentially about the cylindrical film 108.

The film 108 passes between a suitable light emitter source 110 and a photodetector 112. Both the light emitter 110 and detector 112 are multichanneled, having the same number of channels as the film 108 such that one emitter and one detector are uniquely associated with each channel of the film and aligned therewith. Accordingly, the output of the photodetector 112 is an eight bit binary code corresponding to the rotational position of the shaft 104 and corresponding position of film 108 between the elements 110 and 112.

In use, an operator simply turns the shaft 112, rotating the film 108 between the light emitter 110 and photodetector 112, with the photodetector 112 emitting a digital output corresponding to the encoding on the film 108. The output of the decoder 112, maintained within the housing 114, may be applied to a digital controller for regulating power to a controlled element.

It will, of course, be understood that the digitally encoded film may be formed in the shape of a disk, rather than a cylinder. With reference to the embodiment of FIG. 4, if the disk 106 were in fact digitally encoded film, the light emitter 110 and detector 112 might be spaced on opposite sides of the disk 106 such that rotation of the disk would alter the output of the detector 112 in the manner discussed with respect to the cylindrical film 108.

Figure 5A:
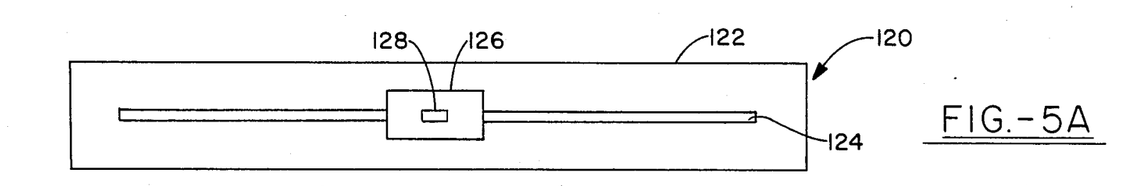
FIG. 5A is a top plan view of a photoelectronic linear digital controller according to the invention.
Figures 5B, 5C, 5D:
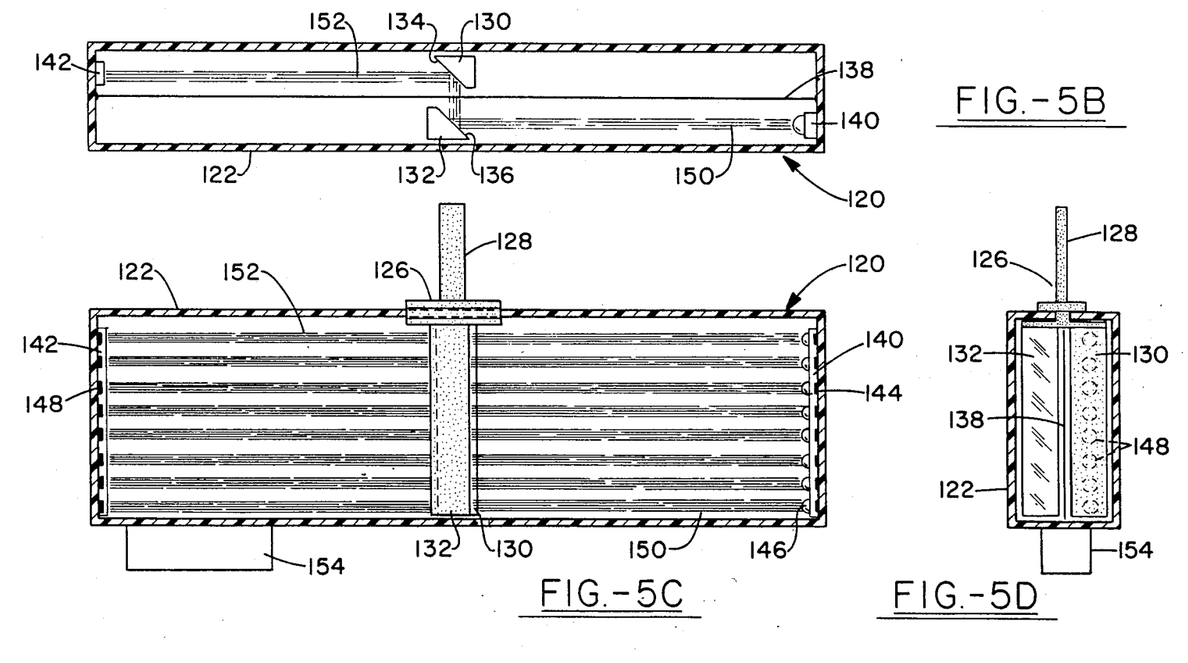
FIG. 5B is a top sectional view of the controller of FIG. 5A.
FIG. 5C is a side sectional view of the controller of FIG. 5A.
FIG. 5D is an end sectional view of the controller of FIG. 5A.

With reference now to FIG. 5, it can be seen that a linear digital photoelectric controller is designated generally by the numeral 120. In this embodiment, a housing 122 is provided with a slot 124 in a side thereof for receiving a slide 126 movable from one end to the other of the slot 124. A tine or handle 128 extends from the slide 126 for ease of handling by an operator.

Maintained within the housing 122 are reflector supports 130,132, each connected to and movable with the slide 126. Reflective surfaces 134,136 are respectively positioned upon the supports 130,132, the reflective surfaces being parallel to each other and preferably at an angle of 45° with respect to the digitally encoded optical film strip 138 maintained therebetween. As previously discussed, the film 138 would typically have eight linear tracks thereon providing for a resolution of 256 selectable outputs.

A beam source 140 consisting of eight light emitting diodes 144 is maintained at a lower first end of the housing, while an eight channel beam detector 142 is maintained at an upper portion of the other end of the housing. As shown, the film 138 passes between the beam source 140 and beam detector 142. In the preferred embodiment of the invention, collimating lenses 146 are presented in association with each of the LED's 144 to collimate the light emitted therefrom. Accordingly, collimated light beams pass through the lenses 146, to the reflective surface 136, through the film 138, from the reflective surface 134, and to an associated one of eight photodetector chips 148 comprising the beam detector 142. As shown in FIG. 5, the source beams are designated by the numeral 150, while the detected beams are designated by the numeral 152. Obviously the presence or absence of any of the eight beams 150,152 will depend upon the position of the slide 126 in relation to the encoding of the film 138 in the manner discussed previously herein. A connector 154 is provided for passing the digital output of the detector 142 to an appropriate digital to analog converter or the like for controlling a power source.

With further respect to FIG. 5, it will be appreciated that the film 138 may be polarized such that alternating channels have a polarization 90° out of phase with the adjacent channel. By then polarizing the associated light source, less precision from the collimation of the light beams 150,152 via the lenses 146 is required. It will further be understood that, as with the structure of FIG.

3, the reflective supports and surfaces 130-136 could be so positioned that the light source 140 and detector 142 are maintained at the same end of the housing 122.

With reference now to FIG. 6, yet another embodiment on the theme of the invention may be seen. Here, a digital slide encoder 160 is shown as having a housing 162 having a slot 164 in a top surface thereof, such slot receiving a slide 166 having a tine or handle 168 extending therefrom. The slide 166 has a pair of pins 170 extending therefrom, each encircled by a compression spring 172 urging against a pressure bar 174. Pressure bar 174 has an arcuate tip 176 positioned to engage a multichanneled membrane switch pad 178 to be discussed hereinafter. As will further be discussed, the switch pad 178 is connected to a connector 180.

Figure 6A:
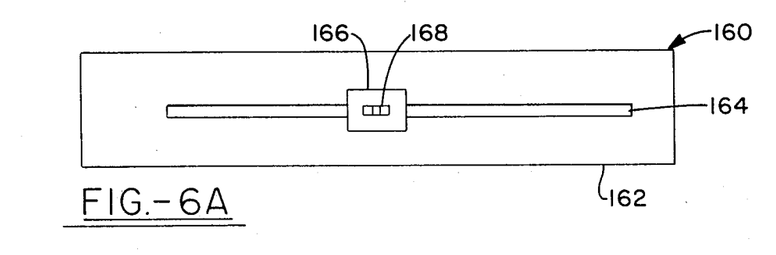
FIG. 6A is a top plan view of a digital slide encoder according to the invention.
Figure 6B:
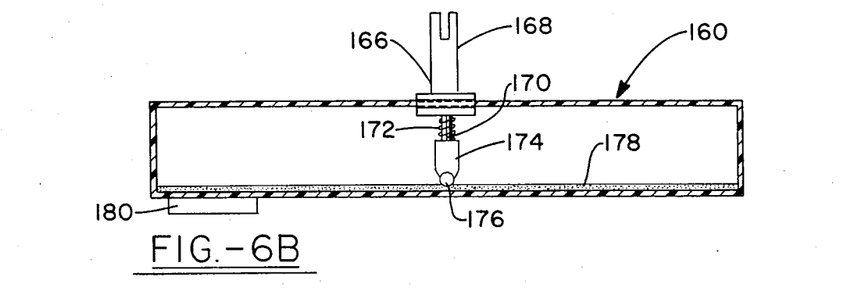
FIG. 6B is a side sectional view of the encoder of FIG. 6A.
Figure 6C:
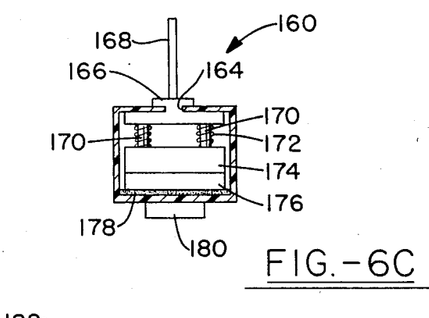
FIG. 6C is an end sectional view of the encoder of FIG. 6A.
Figure 6D:
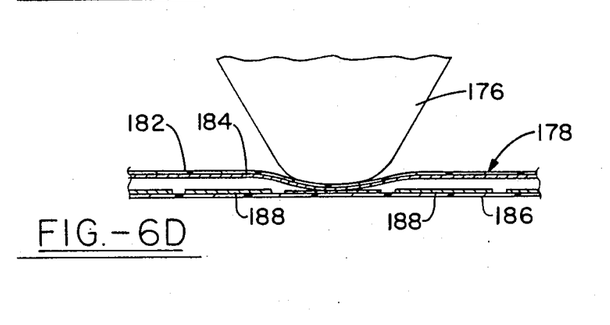
FIG. 6D is an exploded side perspective of the contact film and pressure tip of the encoder of FIG. 6A.
Figure 6E:
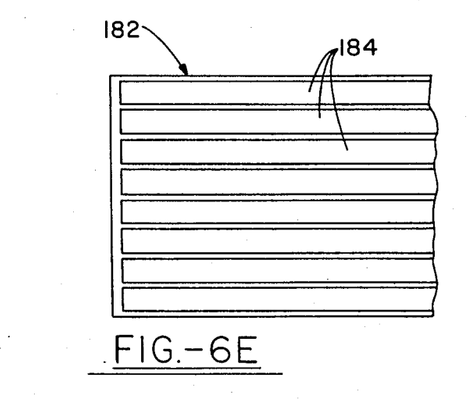
FIG. 6E is a top perspective view of the top membrane of the switch pad of the encoder of FIG. 6A.

The switch pad 178 comprises a top membrane of polyester or other suitable film having silver coating strips 184 longitudinally deposited thereon. There is one such strip 184 for each channel of the switch 178, there being eight such channels or tracks in the preferred embodiment of the invention.

Figure 6F:
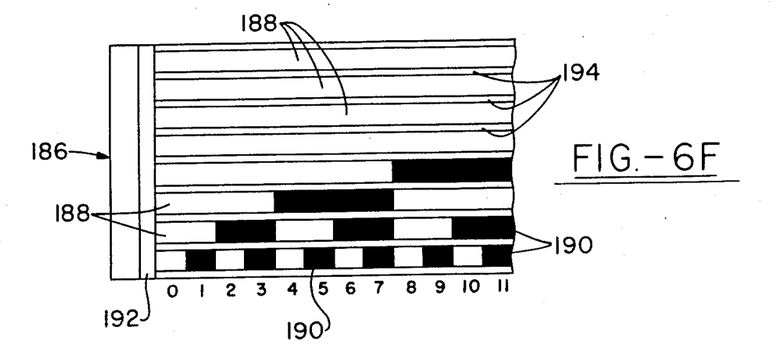
FIG. 6F is a perspective view of the bottom membrane of the switch pad of the encoder of FIG. 6A.

A bottom membrane 186', typically of the same material as the top membrane 182 is provided with silver coating strips 188 longitudinally thereon. A dielectric or other insulating type of material is then selectively deposited on the silver coating strips 188 to define the binary code as presented hereinabove with the various other embodiments. The result is a binary coded strip as shown in FIG. 6F. A shorting strip 192 interconnects the silver coating strips 188 at one end of the membrane 186, while longitudinal non-conductive spacer strips 194 separate and isolate each of the channels of the silver coated strips 188.

Figure 6G:
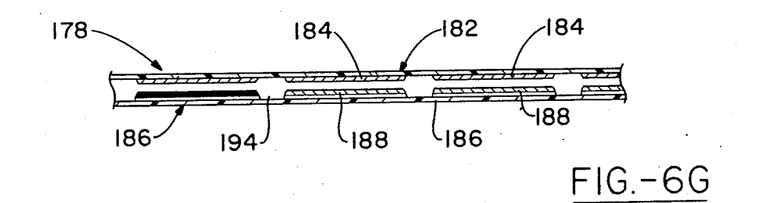
FIG. 6G and 6H are end and side sectional views of the switch pad of the encoder of FIG. 6A.
Figure 6H:
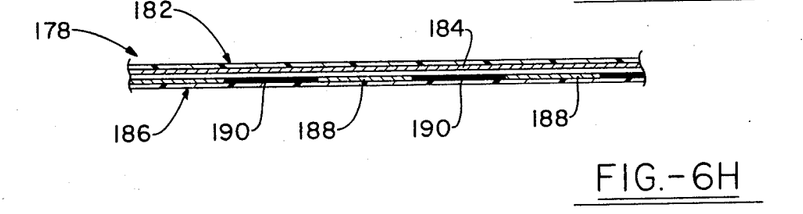

As shown in FIGS. 6G and 6H, the switch pad 178 is thus formed by overlaying the top membrane 182 onto the bottom membrane 186 with the channels or silver coating strips 184 in alignment with the respectively associated strips 188. Movement of the slide 166 thus causes the strips 184,188 to engage each other transversely across the switch pad 178 allowing for conduction between the top membrane 182 and bottom membrane 186 at points dependent upon the position of the slider 166 with respect to the conductive and non-conductive areas as defined by the presence or absence of the dielectric 190.

Figure 7:
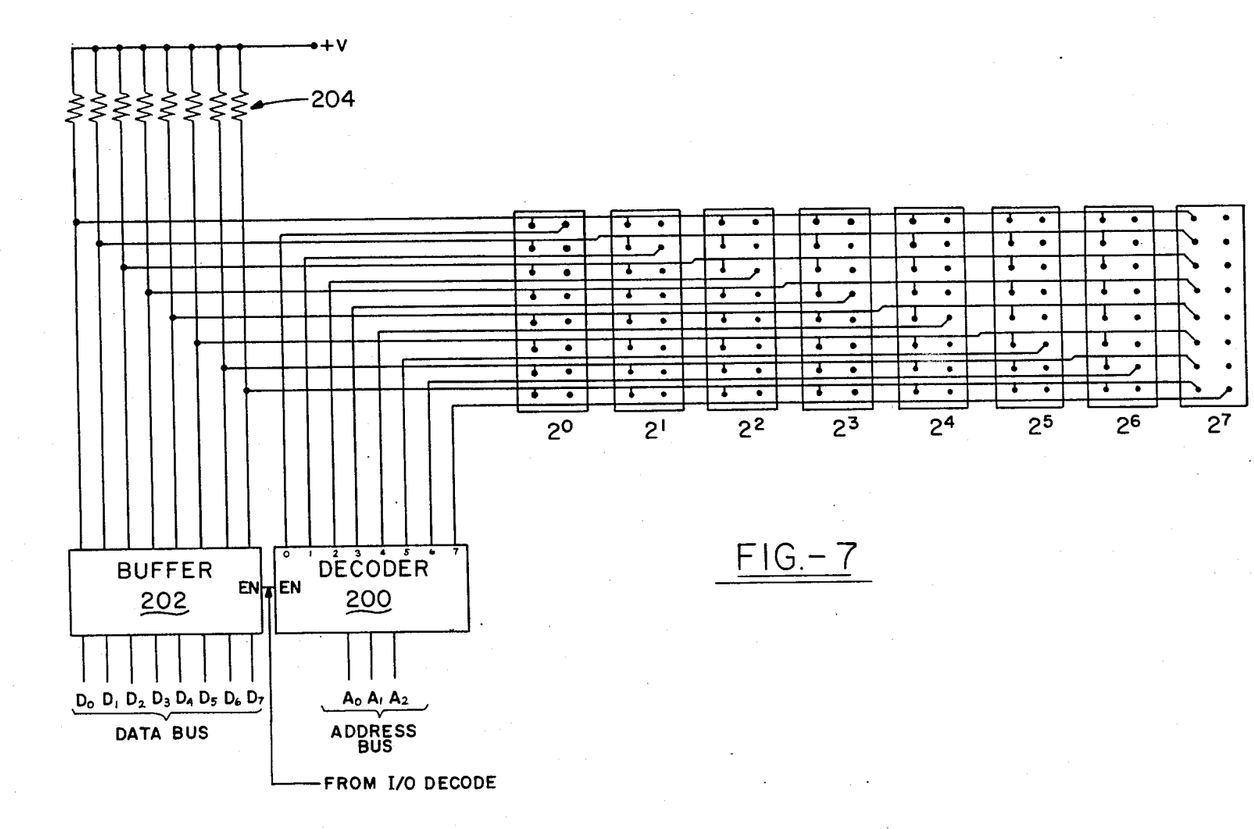
FIG. 7 is a circuit schematic implementation of the structure of FIGS. 6A-H.

FIG. 7 demonstrates the implementation of the structure of FIG. 6. Here, a one of eight decoder 200 is interconnected with the bottom membrane 186 such that each output of the decoder 200 is uniquely associated with one of the conductive strips 188. The tri-state buffer 202 is connected to the top membrane 182 such that each of the inputs to the buffer 202 is uniquely associated with one of the strips 184 of the top membrane 182. As further shown, a resistor array 204 is interconnected between a positive voltage source, corresponding to a logic 1, and each of the inputs of the buffer 202. Accordingly, the input to each of the buffers 202 is normally high. The address inputs of the decoder 200 are sequenced from 0 through 7, sequentially applying a logic 0 on the associated conductive strips 188. With the pressure bar tip 176 causing closure between the top and bottom membranes 182,186, electrical conductivity may then be achieved between the strips 184,188 except where the dielectric 190 is present. Where dielectric 190 exists, the input to the buffer 202 remains at a positive voltage or logic 1 since no conductivity occurs. Where silver-to-silver contact is made between the strips 184 and 188, the associated input to the buffer 202 is pulled down to a logic 0 since the positive voltage drops across the associated resistor of the resistor array 204. Accordingly, the output of the buffer 202 is the binary equivalent of the position of the slider 176 across the switch pad 178.

It will be appreciated for purposes of illustration that, in FIG. 7, the eight membrane channels are shown illustratively as switches.

It should now be appreciated with further respect to FIGS. 6 and 7 that the switch pad 178 could be made in a circular fashion for a rotary controller in much the same manner as discussed above. The concept of the invention simply anticipates the utilization of a switch pad in any geometric configuration and wherein the switch pad is coded in binary progressively along the length or circumference thereof.

Thus it can be seen that the objects of the invention have been satisfied by the structure presented hereinabove. While in accordance with the patent statutes only the best mode and preferred embodiments of the invention have been presented and described in detail, it will be understood that the invention is not limited thereto or thereby. Accordingly, for an appreciation of the true scope and breadth of the invention reference should be had to the following claims.

What is claimed is:

1. An optical potentiometer, comprising:
a housing;
a light source within said housing;
a light sensor within said housing; and
selectively moveable reflecting means within said housing for receiving light from said light source and reflecting a quantom of said light to said light sensor as a function of the position of said reflecting means within said housing, said light sensor providing an ouput signal corresponding to said quantom of light sensed thereby, wherein said reflecting means comprises a slide having a flat surface, said slide moveable longitudinally within said housing, said flat surface being laterally disposed within said housing.

2. The optical potentiometer according to claim 1 wherien said light source and light sensor are maintained at a common end of said housing.

3. The optical potentiometer according to claim 2 wherein said light source is a point source of light isolated from said light sensor by a baffle.

4. A optical potentiometer, comprising:
a housing;
a light source within said housing;
a light source within said housing in juxtaposition to said light source; and
a media of varying optical density maintained between said light source and light sensor, said media adapted for relative movement between said light source and light sensor, wherein said media comprises a film of circular configuration, wherein said film is connected to a handle for rotation between said light source and light sensor, and wherein said light source comprises a plurality of light-emitting members and said light sensor comprises an equal plurality of light sensing members, one light sensing member uniquely associated with each light emitting member wherein said film is divided into an equal plurality of tracks, one said track uniquely associated with each said pair of uniquely associated light-emitting and sensing members, and wherein said film is digitally conded, each said track representing a specific digital power.

5. An optical potentiometer, comprising:
a housing;
a light source within said housing;
a light sensor within said housing; and
selectively moveable reflecting means within said housing for receiving light from said light source and reflecting a quantum of said light to said light sensor as a function of the position of said reflecting means within said housing, said light sensor providing an output signal corresponding to said quantum of light sensed thereby, and wherein said reflecting means comprises a slide having angled reflective surfaces thereon, a first reflective surface in alignment with said light source and receiving light therefrom, and a second reflective surface in alignment with said light sensor and transmitting light thereto.

6. The optical potentiometer according to claim 5 wherein said first reflective surface is angled to reflect light from said light source to said second reflective surface, said second reflective surface angled to transmit said reflected light to said light sensor.

7. The optical potent according to claim 6 which further includes a solid media between said first and second reflective surfaces extending longitudinally within said housing, said media having varying light passing characteristics along the length thereof.

8. The tentiometer according to claim 7 wherein said solid media comprises a film of varying optical density along the length thereof.

9. The optical potentiometer according to claim 8 wherein said optical density of said film varies linerarly along the length of said film as a function of the distance along said film from an end of said housing.

10. The optical potentiometer according to claim 9 wherein said light source is a collimated light source.

11. The optical potentiometer according to claim 7 wherein said light source comprises a plurality of collimated light beams and said light sensor comprises an equal plurality of photodetectors, each photodetector uniquely associated with a separate one of said collimated light beams.

12. The optical potentiometer according to claim 11 wherein said solid media comprises a coded film having uniquely positioned transparent and opaque areas thereon.

13. The optical potentiometer according to claim 12 wherein said film has a plurality of coded tracks thereon equal to the plurality of paired photodetectors and light beams.

14. The optical potentiometer according to claim 13 wherein said film is binary coded.

15. The optical potentiometer according to claim 14 wherein said light beams are generated by a collimated light source connected to a plurality of optical fibers.

16. An optical potentiometer, comprising:
a housing;
a light source within said housing;
a light sensor within said housing in juxtaposition to said light source; and
a solid media of varying optical density maintained between said light source and light sensor, said media adapted for relative movement between said light source and light sensor.

17. The optical potentiometer according to claim 16 wherein said solid media comprises a film of circular configuration.

18. The optical potentiometer according to claim 17 wherein said film is connected to a handle for rotation between said light source and light sensor.

19. The optical potentiometer according to claim 18 wherein said light source comprises a plurality of light emitting members and said light sensor comprises an equal plurality of light sensing members, one light sensing member uniquely associated with each light emitting member and wherein said film is divided into an equal plurality of tracks, one said track uniquely associated with each said pair of uniquely associated light emitting and sensing members.

20. The optical potentiometer according to claim 19 wherein said film is digitally coded, each said track representing a specific digital power.

21. The optical potentiometer according to claim 18 wherein said film is cylindrical.

22. A digital encoder, comprising:
a housing;
a switch pad maintained along an inner first side of said housing; and
a slide received within a second side of said housing opposite said first side, said slide movable along said second side and having a bar transversely engaging said switch pad for selectively activating transverse areas of said switch pad.

23. The digital encoder of claim 22 wherein said switch pad is digitally encoded along the length thereof.

24. The digital encoder of claim 23 wherein said swtich pad comprises a first layer of a plurality of continuously conductive strips and a second layer of an equal plurality of intermittently conductive strips, said second layer having conductive regions defined in a digital pattern.

25. The digital encoder of claim 23 which further comprises a decoding circuit interconnected between said first and second layers of said switch pad for sensing the position of said bar in engagement with said switch pad and emitting a digital signal corresponding thereto.

26. The digital encoder of claim 25 wherein said bar is urged against said switch pad, forcefully closing a portion of said first layer against said second layer.

27. An opticasl potentiometer, comprising:
a housing;
a light source within said housing;
a light sensor within said housing; and
selectively moveable reflecting means within said housing for receiving light from said light source and reflecting a quantum of said light to said light sensor as a function of the position of said reflecting means within said housing, said light sensor providing an output signal corresponding to said quantum of light sensed thereby, wherein said reflecting means comprises a slide having angled reflective surfaces thereon, a first reflective surface in alignment with said light source and receiving light therefrom, and a second reflective surface in alignment with said light sensor and transmitting light thereto, wherein said first reflective surface is angled to reflect light from said light source to said second reflective surface, said second reflective surface angled to transmit said reflected light to said light sensor, said optical potentiometer further including a media between said first and second reflective surfaces extending longitudinal within said housing, said media having varying light passing characteristics along the length thereof, wherein said light source comprises a plurality of collimated light beams and said light sensor comprises an equal plurality of photodetectors, each photodetector uniquely associated with a separate one of said collimated light beams, wherein said media comprises a coded film having uniquely positioned transparent and opaque areas thereon, and wherein said film has a plurality of coded tracks thereon equal to the plurality of paired photodectors and light beams.

28. An optical potentiometer, comprising:
a housing;
a light source within said housing;
a light sensor within said housing and
selectively moveable reflecting means within said housing for receiving light from said light source and reflecting a quantum of said light to said light sensor as a fucntion of the position of said reflecting means within said housing, said light sensor providing an output signal corresponding to said quantum of light sensed thereby, wherein said reflecting means comprises a slide having angled reflective surfaces thereon, a first reflective surface in alignment with said light source and receiving light therefrom, and second reflective surface in alginment with said light sensor and transmitting light thereto, wherein said first reflective surface is angled to reflect light from said light source to said second reflective surface, said second reflective surface angled to transmit said reflected light to said light sensor, said optical potentiometer further including a media between said first and and second reflective surfaces extending longitudinally within said housing, said media having varying light passing characteristics along the length thereof, wherein said light source comprises a plurality of collimated light beams and said light sensor comprises an equal plurality of photodetectors, each photodetector uniquely associated with a separate one of said collimated light beams, wherein said media comprises a coded film having uniquely positioned transparent and opaque are as thereon, wherein said film has a plurality of coded tracks thereon equal to the plurality of paired photodectors and light beams, and wherein said film is binary coded.

29. An optical potentiometer, comprising:
a housing;
a light source within said housing;
a light sensor within said housing; and
selectively moveable reflecting means within said housing for receving light from said light source and reflecting a quantum of said light to said light sensor as a function of the position of said reflecting means within said housing, said light sensor providing an output signal corresponding to said quantum of light sensed thereby, wherein said reflecting means comprises a slide having angled reflective surfaces thereon, a first reflective surface in alignment with said light source and receiving light therefrom, and a second reflective surface in alignment with said light sensor and transmitting light thereto, wherein said first reflective surface is angled to reflect light from said light source to said second reflective surface, said second reflective surface angled to transmit said reflected light to said light sensor, said optical potentiometer further including a media between said first and second reflective surfaces extending longitudinally within said housing, said media having varying light passign characteristics along the length thereof, wherein said light source comprises a plurality of collimated light beams and said light sensor comprises an equal plurality of photodetectors, each photodetector uniquely associated with a separate one of said collimated light beams, wherein said media comprises a coded film having uniquely positioned transparent and opaque areas thereon, wherein said film has a plurality of coded tracks thereon equal to the plurality of paired photodetectors and light beams, wherein said film is binary coded, and wherein said light beams are generated by a collimated light source connected to a plurality of optical fibers.

30. An optical potentiometer, comprising:
a housing;
a light source within said housing;
a light source within said housing in juxtapositioned to said light source; and
a media of varying optical density maintained between saids light source and light sensor, said media adapted for relative movement between said light source and light sensor, wherein said media comprises a film of circular configuration, wherein said film is connected to a handle for rotation between said light source and light sensor, and wherien said light source comprises a plurality of light-emitting members and said light sensor comprises an equal plurality of light sensing members, one light sensing member uniquely associated with each light emitting member and wherein said film is divided into an equal plurality of tracks, one said track uniquely associated with each said pair of uniquely associated light emitting and sensing members.

* * * * *